(12) United States Patent
Kim et al.

(10) Patent No.: US 11,106,133 B2
(45) Date of Patent: Aug. 31, 2021

(54) POSITIVE-TYPE PHOTOSENSITIVE RESIN COMPOSITION AND CURED FILM PREPARED THEREFROM

(71) Applicant: ROHM AND HAAS ELECTRONIC MATERIALS KOREA LTD., Chungcheongnam-do (KR)

(72) Inventors: Yeonok Kim, Gyeonggi-do (KR); Geun Huh, Gyeonggi-do (KR); Ju-Young Jung, Gyeonggi-do (KR); Jung-Hwa Lee, Gyeonggi-do (KR); Jong Han Yang, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 260 days.

(21) Appl. No.: 16/192,013

(22) Filed: Nov. 15, 2018

(65) Prior Publication Data
US 2019/0204737 A1    Jul. 4, 2019

(30) Foreign Application Priority Data

Dec. 29, 2017  (KR) .................. 10-2017-0183384

(51) Int. Cl.
| | | |
|---|---|---|
| *G03F 7/039* | (2006.01) | |
| *G03F 7/075* | (2006.01) | |
| *G03F 7/038* | (2006.01) | |
| *G03F 7/023* | (2006.01) | |
| *C08G 77/392* | (2006.01) | |
| *C08G 77/388* | (2006.01) | |
| *H01L 27/12* | (2006.01) | |

(52) U.S. Cl.
CPC ......... *G03F 7/0392* (2013.01); *C08G 77/388* (2013.01); *C08G 77/392* (2013.01); *G03F 7/0233* (2013.01); *G03F 7/038* (2013.01); *G03F 7/0757* (2013.01); *G03F 7/023* (2013.01); *H01L 27/1218* (2013.01)

(58) Field of Classification Search
None
See application file for complete search history.

(56) References Cited

U.S. PATENT DOCUMENTS

| | | | | |
|---|---|---|---|---|
| 6,984,476 B2* | 1/2006 | Kobayashi | ........ | G02F 1/136227 430/191 |
| 2011/0097835 A1* | 4/2011 | Park | .................... | H01L 27/1288 438/34 |

FOREIGN PATENT DOCUMENTS

| | | | |
|---|---|---|---|
| EP | 0568 476 A2 * | 11/1993 | |
| JP | 5099140 B | 12/2012 | |

OTHER PUBLICATIONS

Ng, J-Diazonaphthoquinone-Substituted Siloxane as a Dissolution Inhibitor in Photolithography, 1995, available online at https://lbezone.ust.hk/pdfviewer/web/viewer.php?file=aHR0cHM6Ly9sYmV6b25ILnVzdC5oay9vYmovMS9vL2I0OTIwNTYvYjQ5MjA1Ni5wZGY=#page=1 (Year: 1995).*

* cited by examiner

*Primary Examiner* — Anca Eoff
(74) *Attorney, Agent, or Firm* — G. Creston Campbell

(57) ABSTRACT

The present invention relates to a positive-type photosensitive resin composition and a cured film prepared therefrom. The positive-type photosensitive resin composition comprises an acrylic resin and a siloxane copolymer containing a sulfonated diazoquinone group at the terminal thereof. Thus, the film retention rate and adhesiveness can be further enhanced, while the sensitivity is maintained.

9 Claims, No Drawings

POSITIVE-TYPE PHOTOSENSITIVE RESIN COMPOSITION AND CURED FILM PREPARED THEREFROM

CROSS REFERENCE TO RELATED APPLICATIONS

The instant application claims priority to the application No. 10-2017-0183384 filed on Dec. 29, 2017 in the Republic of Korea.

TECHNICAL FIELD

The present invention relates to a photosensitive resin composition and a cured film prepared therefrom. More specifically, the present invention relates to a positive-type photosensitive resin composition that is excellent in film retention rate and adhesiveness and a cured film prepared therefrom to be used in a liquid crystal display, an organic EL display, and the like.

BACKGROUND ART

In general, a transparent planarization film is formed on a substrate of a thin film transistor (TFT) for the purpose of insulation to prevent a contact between a transparent electrode and a data line in a liquid crystal display, an organic EL display, or the like. Through a transparent pixel electrode positioned near the data line, the aperture ratio of a panel may be enhanced, which makes it possible to attain high luminance/resolution. In order to form such a transparent planarization film, several processing steps are employed to impart a specific pattern profile, and a positive-type photosensitive resin composition is widely employed in this process since fewer processing steps are required.

In connection with the conventional positive-type photosensitive resin compositions, technologies of using a siloxane polymer, an acrylic resin, and the like as raw materials have been introduced.

An acrylic resin may improve the chemical resistance of a cured film by virtue of the crosslinking characteristics of acryl, whereas it has a problem that the film retention rate is low and that the bonding force with a lower substrate is weak, resulting in poor adhesiveness. A siloxane polymer has advantages in that its film retention rate is high and that the silanol group can act as a binder with a lower substrate, thereby enhancing the adhesiveness as compared with an acrylic resin.

Thus, a technology aiming to provide a composition that has all the advantages of an acrylic resin and a siloxane polymer by employing them together and a cured film formed therefrom has been proposed (see Japanese Patent No. 5,099,140). However, it has a disadvantage in that the film retention is low since the siloxane polymer has a higher dissolution rate than that of the acrylic resin at the time of development, whereby the adhesiveness and film retention rate cannot be improved to a satisfactory level.

PRIOR ART DOCUMENT

Patent Document (Patent Document 1) Japanese Patent No. 5,099,140

DISCLOSURE OF THE INVENTION

Technical Problem to be Solved

Accordingly, in order to solve the above-mentioned problems, the present invention aims to provide a positive-type photosensitive resin composition and a cured film prepared therefrom to be used in a liquid crystal display, an organic EL display, and the like. The positive-type photosensitive resin composition comprises an acrylic resin and a siloxane polymer together as a binder. A diazoquinone group having photoactivity is introduced at the terminal of the siloxane polymer, i.e., the silanol group of the siloxane polymer. The diazoquinone group is activated by light upon exposure to light, so that the dissolution is suppressed in an unexposed area at the time of development, while the dissolution rate is maintained in an exposed area. Thus, the adhesiveness and film retention rate can be further enhanced.

Solution to the Problem

In order to accomplish the above object, the present invention provides a positive-type photosensitive resin composition, which comprises (A) a siloxane copolymer containing a photoactive group at the terminal thereof, the photoactive group being activated by light; (B) an acrylic copolymer; and (C) a solvent.

In order to accomplish the other object, the present invention provides a process for preparing a siloxane copolymer, which comprises (1) copolymerizing at least two silane compounds represented by the following Formula 1 to obtain a siloxane copolymer; and (2) reacting a sulfonated diazoquinone-based compound with the siloxane copolymer to introduce a sulfonated diazoquinone group at the terminal of the siloxane copolymer:

$$(R1)_n Si(OR2)_{4-n} \qquad \text{[Formula 1]}$$

In the above Formula 1, n is an integer of 0 to 3, R1 is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and R2 is each independently hydrogen, $C_{1-6}$ alkyl, $C_{2-6}$ acyl, or $C_{6-15}$ aryl, wherein the heteroalkyl, the heteroalkenyl, and the heteroaryl each independently have at least one heteroatom selected from the group consisting of O, N, and S.

In order to accomplish still the other object, the present invention provides a cured film prepared from the positive-type photosensitive resin composition.

Advantageous Effects of the Invention

The positive-type photosensitive resin composition of the present invention comprises a siloxane copolymer containing a sulfonated diazoquinone group as a photoactive group at the terminal thereof, wherein the photoactive group is activated by light. The silanol group is protected by the sulfonated diazoquinone group in an unexposed area at the time of formation of a cured film, which lowers the dissolution rate of the siloxane copolymer. Thus, the film retention rate and adhesiveness can be further enhanced. Further, the sulfonated diazoquinone group is converted to a carboxyl group by an ultraviolet ray in an exposed area. Thus, it can be readily dissolved in a developer (i.e., with an enhanced solubility) in the development step, whereby the sensitivity (or pattern contrast) can be maintained.

DETAILED DESCRIPTION FOR CARRYING OUT THE INVENTION

The positive-type photosensitive resin composition of the present invention comprises (A) a siloxane copolymer containing a photoactive group at the terminal thereof, the photoactive group being activated by light; (B) an acrylic copolymer; and (C) a solvent. If necessary, the positive-type photosensitive resin composition may further comprise (D) a 1,2-quinonediazide-based compound; (E) an epoxy compound; (F) at least one silane compound represented by the following Formula 3; (G) a surfactant; and/or (H) an adhesion supplement.

As used herein, the term "(meth)acryl" refers to "acryl" and/or "methacryl," and the term "(meth)acrylate" refers to "acrylate" and/or "methacrylate."

The weight average molecular weight of each component as described below is measured by gel permeation chromatography (GPC, eluent: tetrahydrofuran) using a polystyrene standard.

(A) Siloxane Copolymer

The positive-type photosensitive resin composition of the present invention comprises a siloxane copolymer (or a polysiloxane) containing a photoactive group at the terminal thereof, wherein the photoactive group is activated by light. In such event, the photoactive group may be a sulfonated diazoquinone group derived from a sulfonated diazoquinone-based compound. The details thereof will be given below.

The siloxane copolymer (A) comprises a condensate of a silane compound and/or a hydrolysate thereof. In such event, the silane compound or the hydrolysate thereof may be a monofunctional to tetrafunctional silane compound.

As a result, the siloxane copolymer (A) may comprise a siloxane structural unit selected from the following Q, T, D, and M types:

Q type siloxane structural unit: a siloxane structural unit comprising a silicon atom and adjacent four oxygen atoms, which may be derived from, e.g., a tetrafunctional silane compound or a hydrolysate of a silane compound that has four hydrolyzable groups.

T type siloxane structural unit: a siloxane structural unit comprising a silicon atom and adjacent three oxygen atoms, which may be derived from, e.g., a trifunctional silane compound or a hydrolysate of a silane compound that has three hydrolyzable groups.

D type siloxane structural unit: a siloxane structural unit comprising a silicon atom and adjacent two oxygen atoms (i.e., a linear siloxane structural unit), which may be derived from, e.g., a difunctional silane compound or a hydrolysate of a silane compound that has two hydrolyzable groups.

M type siloxane structural unit: a siloxane structural unit comprising a silicon atom and one adjacent oxygen atom, which may be derived from, e.g., a monofunctional silane compound or a hydrolysate of a silane compound that has one hydrolyzable group.

For example, the siloxane copolymer (A) may comprise a structural unit derived from a compound represented by the following Formula 1. For example, the siloxane copolymer may be a condensate of a silane compound and/or a hydrolysate thereof.

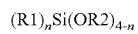

[Formula 2]

In the above Formula 1, n is an integer of 0 to 3, R1 is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and R2 is each independently hydrogen, $C_{1-6}$ alkyl, $C_{2-6}$ acyl, or $C_{6-15}$ aryl, wherein the heteroalkyl, the heteroalkenyl, and the heteroaryl each independently have at least one heteroatom selected from the group consisting of O, N, and S.

Examples of the structural unit wherein R1 has a heteroatom include an ether, an ester, and a sulfide.

The compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrichlorosilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, $d^3$-methyltrimethoxysilane, nonafluorobutylethyltrimethoxysilane, trifluoromethyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetany)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, and butyltrimethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

As described above, the siloxane copolymer (A) may contain a photoactive group at the terminal thereof, wherein the photoactive group is activated by light. The photoactive group may be a sulfonated diazoquinone group derived from a sulfonated diazoquinone-based compound. Specifically, the sulfonated diazoquinone group may be a sulfonated diazobenzoquinone group or a sulfonated diazonaphthoquinone group.

The sulfonated diazoquinone-based compound may include structural isomers having different bonding positions (4-, 5-, 6-) of the sulfone groups and/or those having different bonding positions of nitrogen, oxygen, or the like. For example, it may be

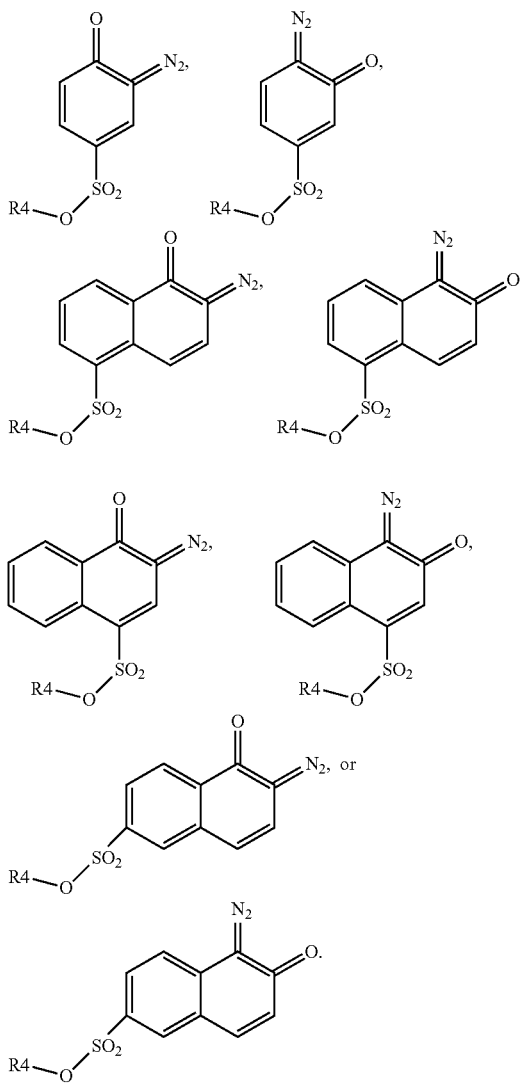

In the above, R4 may be a $C_{1-10}$ alcohol or a ballast residue having 2 to 6 phenol groups. The details thereof will be given below.

Specifically, the siloxane copolymer (A) may contain 4-diazonaphthoquinone sulfonic acid, 5-diazonaphthoquinone sulfonic acid, or 6-diazonaphthoquinone sulfonic acid at the terminal thereof. Preferably, the siloxane copolymer is chemically stable and excellent in terms of the photosensitivity when it contains 4-diazonaphthoquinone sulfonic acid or 5-diazonaphthoquinone sulfonic acid.

Some of the sulfonated diazoquinone-based compound may be converted to a structure having a carboxyl group by light such as an ultraviolet ray (see the following Reaction Scheme 1).

[Reaction Scheme 1]

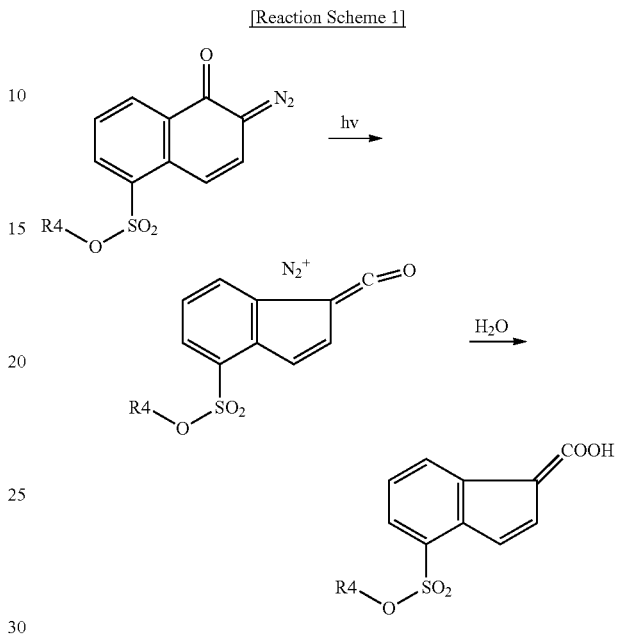

In the above Reaction Scheme 1, R4 is as described above.

Referring to the above Reaction Scheme 1, the sulfonated diazoquinone-based compound is converted to a structure of indene ketene by an ultraviolet ray. If the indene ketene structure reacts with water, it is converted to a structure of 3-indene carboxylic acid, which is soluble in an alkali. Such structural changes give rise to a difference between an exposed area and an unexposed area in the dissolution rate of the siloxane copolymer (A) in an aqueous alkaline solution used as a developer at the time of development.

Specifically, such structural changes enable the siloxane copolymer (A) containing a sulfonated diazoquinone group derived from the sulfonated diazoquinone-based compound present in an area exposed to an ultraviolet ray to be readily dissolved in an aqueous alkaline solution (i.e., dissolution expedition). On the other hand, since such structural changes do not take place in an unexposed area, the siloxane copolymer tends to show dissolution inhibition. Accordingly, the difference between the exposed area and the unexposed area in the dissolution rate of the siloxane copolymer (A) can not only realize a positive-type pattern, but also attain a more excellent film retention rate. That is, the silanol group is protected by the sulfonated diazoquinone group in the unexposed area at the time of formation of a cured film, which lowers the dissolution rate of the siloxane copolymer. Thus, the film retention rate and adhesiveness can be further enhanced. Further, the sulfonated diazoquinone group is converted to a carboxyl group by an ultraviolet ray in the exposed area. Thus, it can be readily dissolved in a developer (i.e., with an enhanced solubility) in the development step, whereby the sensitivity (or pattern contrast) can be maintained.

The siloxane copolymer (A) containing a sulfonated diazoquinone group at the terminal thereof as described above may have the following structure. Specifically, the siloxane copolymer (A) may comprise at least one selected from the structural units represented by the following Formulae 2 to 4:

[Formula 2]

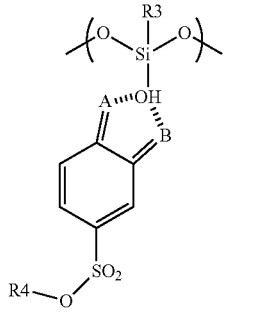

[Formula 3]

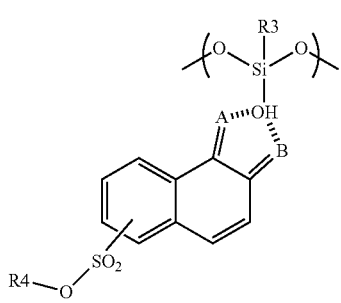

[Formula 4]

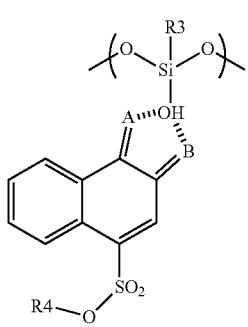

In the above Formulae, A is O or $N_2$, B is $N_2$ when A is O, B is O when A is $N_2$, R3 is a $C_{1-12}$ alkyl group, a $C_{2-10}$ alkenyl group, a $C_{6-15}$ aryl group, a 3- to 12-membered heteroalkyl group, a 4- to 10-membered heteroalkenyl group, or a 6- to 15-membered heteroaryl group, and R4 is a $C_{1-10}$ alcohol or a ballast residue having 2 to 6 phenol groups.

More specifically, R4 may be an alcohol such as methanol, ethanol, propanol, or the like. Further, R4 may be a $C_{10-50}$ aromatic group having 2 to 6 phenol groups, i.e., a phenolic hydroxyl group. R4 may be sulfone and ester groups bonded to a DQ group or a DNQ group.

Examples of a compound that is capable of forming the ballast residue may include

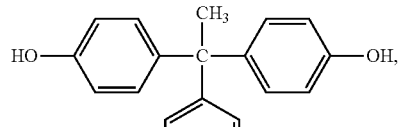
(TrisP-HAP)

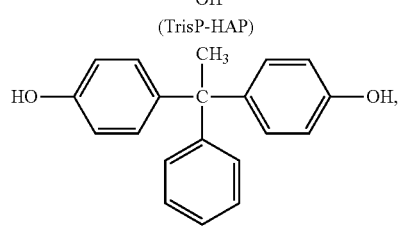
(BisP-AP)

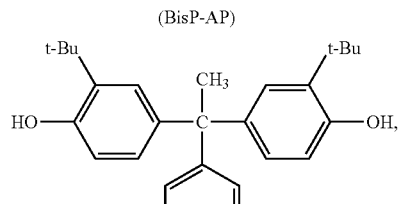
(BisOTBP-AP)

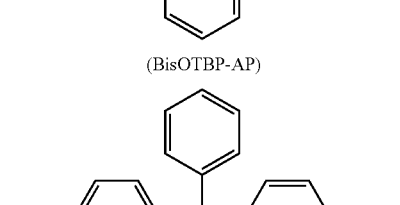
(BisP-DP)

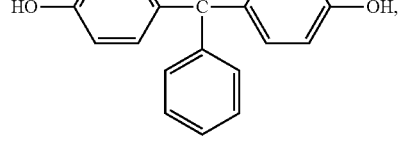
(Ph-cc-AP)

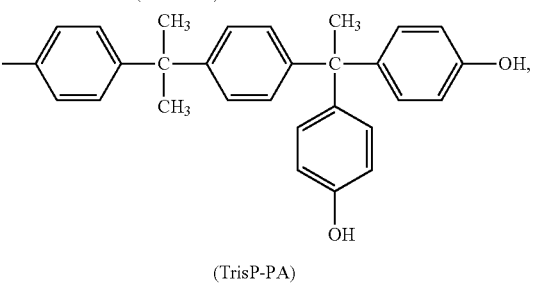
(TrisP-PA)

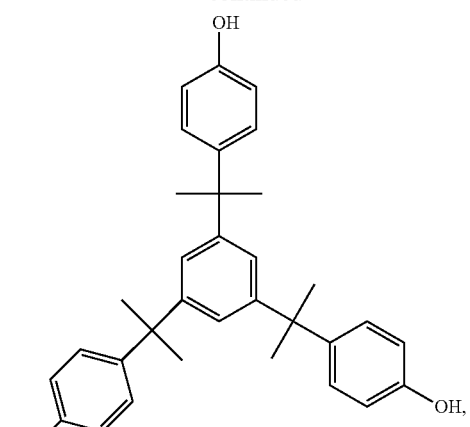
(TrisP-TC)
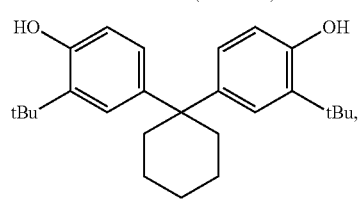
(BisOTBP-Z)
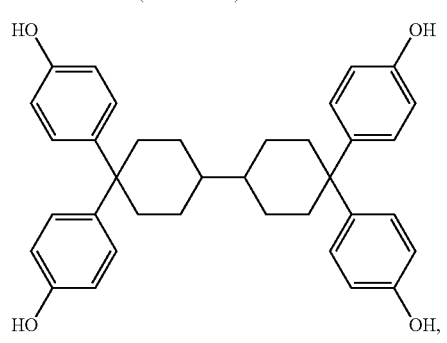
(TekP-4HBP)
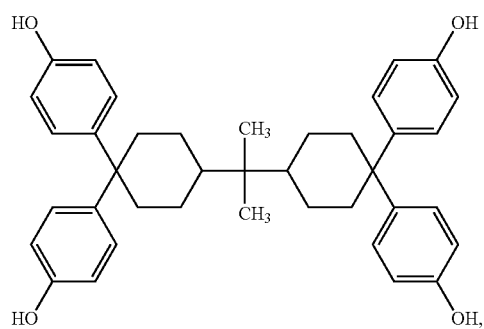
(TekP-4HBPA)
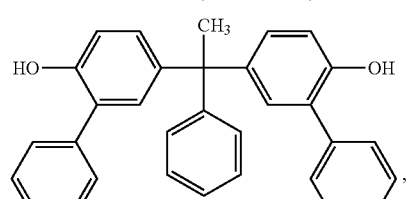
(BisOPP-AP)
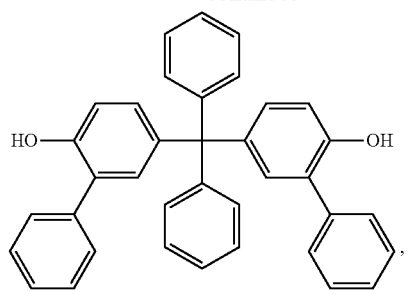
(TPM-DP)
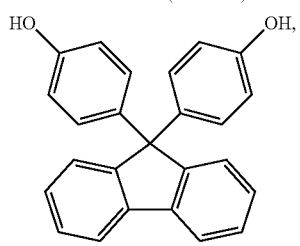
(Bis-FL)
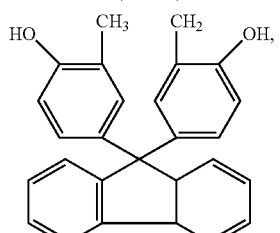
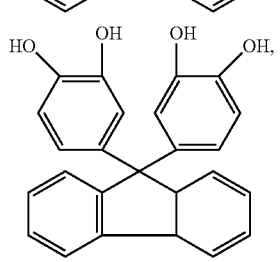
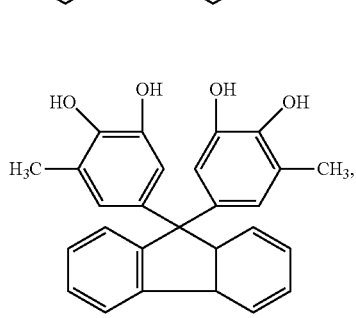
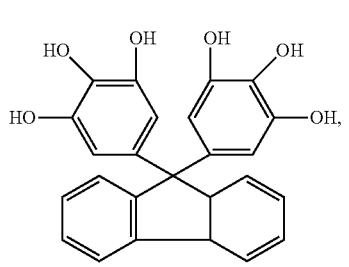
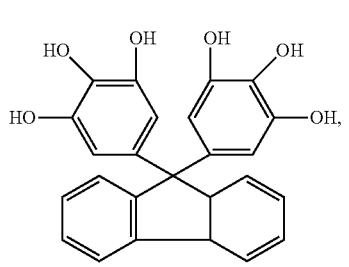

-continued

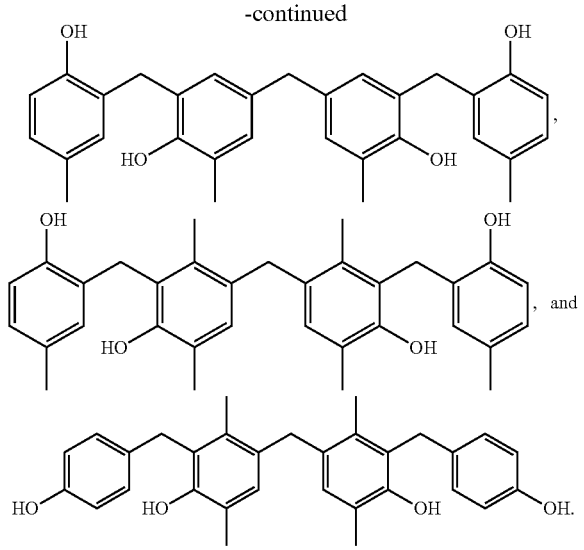

Specifically, the compound that forms the ballast residue may have two or more, or three or more, phenol groups. More specifically, when the compound is

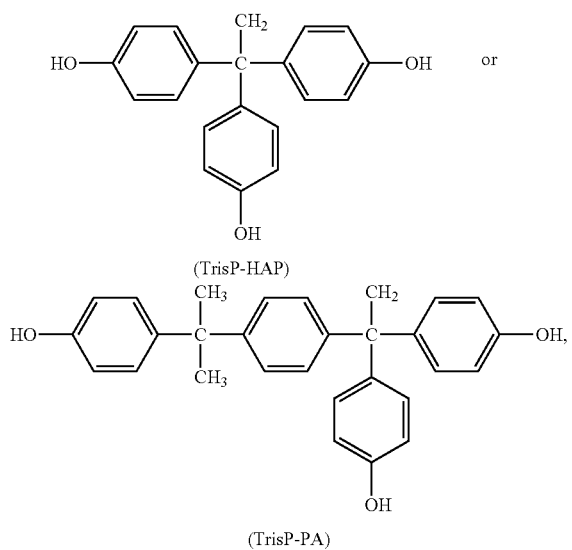

it is chemically stable once it has been bonded to a siloxane copolymer and advantageous in terms of the pattern formation and developability at the time of development.

The siloxane copolymer (A) may comprise at least one selected from the structural units of the above Formulae 2 to 4 in an amount of 1 to 99% by mole based on the total molar amount of the structural units of the siloxane copolymer. Within the above range, it is possible to further enhance the film retention rate and the sensitivity at the time of exposure to an ultraviolet ray and development.

The sulfonated diazoquinone group may be activated by a light source such as a low-pressure mercury lamp, a high-pressure mercury lamp, an extra high-pressure mercury lamp, a metal halide lamp, an argon gas laser, an X-ray, an electron beam, and the like. Specifically, the siloxane copolymer (A) may have an increased solubility in an aqueous alkaline solution when it is irradiated with light at an exposure rate of 5 to 200 mJ/cm$^2$ based on a wavelength of 365 nm in a wavelength band of 200 to 500 nm. More specifically, the solubility may be increased by about 200 to 900% or about 200 to 800%.

Further, the siloxane copolymer (A) containing a sulfonated diazoquinone group at the terminal thereof may be prepared by the following process. Specifically, it may be prepared by a process, which comprises (1) copolymerizing at least two silane compounds represented by the above Formula 1 to obtain a siloxane copolymer; and (2) reacting a sulfonated diazoquinone-based compound with the siloxane copolymer to introduce a sulfonated diazoquinone group at the terminal of the siloxane copolymer.

More specifically, in the above step (1), two or more silane compounds of the above Formula 1 are hydrolyzed and/or condensed to obtain a hydrolysate or a condensate thereof. The conditions for obtaining a hydrolysate or a condensate of the silane compound of the above Formula 1 are not particularly limited. For example, the silane compounds of Formula 1 are optionally diluted with a solvent such as ethanol, 2-propanol, acetone, butyl acetate, or the like, and water that is essential for the reaction and an acid (e.g., hydrochloric acid, acetic acid, nitric acid, or the like) or a base (e.g., ammonia, triethylamine, cyclohexylamine, tetramethylammonium hydroxide, or the like) as a catalyst are added thereto, followed by stirring the mixture to complete the hydrolysis polymerization reaction, whereby the desired hydrolysate or condensate thereof can be obtained.

The weight average molecular weight of the condensate (or siloxane copolymer) obtained by the hydrolysis polymerization of the silane compounds of the above Formula 1 is preferably in the range of 500 to 50,000 Da (=g/mole). Within the above range, it is more preferable in terms of the film formation characteristics, solubility, dissolution rates in a developer, and the like.

The type and amount of the solvent or the acid or base catalyst used herein may be arbitrarily selected without limitation. The hydrolysis polymerization reaction may be carried out at a low temperature of 20° C. or lower. But the reaction may be expedited by heating or refluxing. The required reaction time varies with the type and concentration of the silane monomers, reaction temperature, and the like. It usually takes 15 minutes to 30 days for the reaction to proceed until the molecular weight of the condensate thus obtained becomes approximately 500 to 50,000 Da. However, the reaction time is not limited to this range.

Next, in the step (2), the siloxane copolymer and the sulfonated diazoquinone-based compound are vigorously stirred at room temperature for 3 hours for a reaction thereof to introduce a sulfonated diazoquinone group, specifically a sulfonated diazobenzoquinone group or a sulfonated diazonaphthoquinone group, at the terminal of the siloxane copolymer.

In the above step (2), the sulfonated diazoquinone-based compound is employed in an amount ranging from 0.1 to 0.75 part by weight based on 100 parts by weight of the siloxane copolymer on the basis of the solids content.

Further, the positive-type photosensitive resin composition of the present invention may be prepared by introducing a sulfonated diazoquinone group at the terminal of the siloxane copolymer by the process as described above, followed by mixing the siloxane copolymer with an acrylic copolymer.

Specifically, the positive-type photosensitive resin composition of the present invention may be prepared by a process, which comprises (a) copolymerizing two or more silane compounds represented by the following Formula 1 to obtain a siloxane copolymer, (b) reacting a sulfonated diazoquinone-based compound with the siloxane copolymer to introduce a sulfonated diazoquinone group at the terminal of the siloxane copolymer, (c) adding an acrylic copolymer thereto, and (d) adding a solvent thereto, followed by uniformly mixing the mixture.

The above steps (a) and (b) may be carried out in the same manner as the process for preparing the siloxane copolymer (A) (i.e., steps (1) and (2)).

Thereafter, an acrylic copolymer is added thereto for mixing and reacting the siloxane copolymer (A) and the acrylic copolymer (step (c)). The siloxane copolymer (A) containing a sulfonated diazoquinone group at the terminal thereof serves to compensate for the disadvantage of the acrylic copolymer such as low adhesive force with a lower substrate and to enhance the film retention rate of the photosensitive resin composition.

Specifically, the sulfonated diazoquinone-based compound is first reacted with the siloxane copolymer to introduce a sulfonated diazoquinone group at the terminal of the siloxane copolymer. Then, the siloxane copolymer is mixed with the acrylic copolymer.

If a mixture of the siloxane copolymer (before the introduction of a sulfonated diazoquinone group) and the acrylic copolymer is mixed with the sulfonated diazoquinone-based compound, the bonding between the carboxyl group contained in the acrylic copolymer and the sulfonated diazoquinone group contained in the sulfonated diazoquinone-based compound takes place more competitively than the hydrogen bond formation reaction between the silanol group of the siloxane copolymer and the sulfonated diazoquinone group. As a result, the sulfonated diazoquinone group is not sufficiently introduced to the silanol group at the terminal of the siloxane copolymer. Thus, the siloxane copolymer (in which the sulfonated diazoquinone group and the silanol group are not bonded to each other) remaining at the time of development after exposure to light would rapidly be dissolved, which causes the problems that the film retention rate is lowered and that the adhesiveness is impaired.

In order to solve these problems in the present invention, the siloxane copolymer is first associated with the sulfonated diazoquinone group and then mixed with the acrylic copolymer, whereby the dissolution rate of the siloxane copolymer present in an unexposed area in an alkaline developer can be lowered.

Therefore, when a substrate coated with the photosensitive resin composition comprising the siloxane copolymer (A) of the present invention is exposed to an ultraviolet ray, the dissolution rate of an exposed area becomes faster while the dissolution rate of an unexposed area becomes slower. Thus, it is possible to produce an effect of enhancing the adhesiveness and the film retention rate as the power to retain the film to the substrate is improved.

Then, in the step (d), a solvent is added and uniformly mixed to prepare a photosensitive resin composition.

The details on the solvent will be given below.

The siloxane copolymer (A) may comprise a linear siloxane structural unit (i.e., D-type structural unit). This linear siloxane structural unit may be derived from a difunctional silane compound, for example, a compound represented by the above Formula 1 where n is 2. Specifically, the siloxane copolymer (A) may comprise a structural unit derived from a compound represented by the above Formula 1 where n is 2 in an amount of 0.5 to 50% by mole, preferably 1 to 30% by mole, based on an Si atomic molar number. Within the above range, it is possible that a cured film may have flexible characteristics while maintaining a certain level of hardness, whereby the crack resistance to an external stress can be further enhanced.

Further, the siloxane copolymer (A) may comprise a structural unit derived from a silane compound represented by the above Formula 1 where n is 1 (i.e., T-type structural unit). The siloxane copolymer (A) may comprise a structural unit derived from a compound represented by the above Formula 1 where n is 1 in an amount of, preferably 40 to 85% by mole or, more preferably 50 to 80% by mole, based on an Si atomic molar number. Within the above range, it is more advantageous to form a precise pattern profile.

In addition, it is preferable that the siloxane copolymer (A) comprises a structural unit derived from a silane compound having an aryl group in terms of the hardness, sensitivity, and film retention rate. For example, the siloxane copolymer (A) may comprise a structural unit derived from a silane compound having an aryl group in an amount of 30 to 70% by mole, preferably 35 to 50% by mole, based on an Si atomic molar number. The structural unit derived from a silane compound having an aryl group may be, for example, a structural unit derived from a silane compound of the above Formula 1 where R1 is an aryl group, preferably a silane compound of the above Formula 1 where n is 1 and R1 is an aryl group, particularly a silane compound of the above Formula 1 where n is 1 and R1 is a phenyl group (i.e., T-phenyl type structural unit).

The siloxane copolymer (A) may comprise a structural unit derived from a silane compound represented by the above Formula 1 where n is 0 (i.e., Q-type structural unit). The siloxane copolymer (A) may comprise a structural unit derived from a compound represented by the above Formula 1 where n is 0 in an amount of 10 to 40% by mole, preferably 15 to 35% by mole, based on an Si atomic molar number. Within the above range, the photosensitive resin composition may maintain its solubility in an aqueous alkaline solution at a proper level at the time of formation of a pattern. Thus, it is possible to prevent any defects, which may be caused by a reduction in the solubility, or a drastic increase in the solubility of the composition.

The term "% by mole based on an Si atomic molar number" as used herein refers to a percentage of the number of moles of Si atoms contained in a specific structural unit with respect to the total number of moles of Si atoms contained in all of the structural units constituting the siloxane polymer.

The molar amount of a siloxane unit in the siloxane copolymer (A) may be measured by the combination of Si-NMR, $^1$H-NMR, $^{13}$C-NMR, IR, TOF-MS, elementary analysis, measurement of ash, and the like. For example, in order to measure the molar amount of a siloxane unit having a phenyl group, an Si-NMR analysis is performed on the entire siloxane polymer. Then, an analysis of a phenyl-bound Si peak area and a phenyl-unbound Si peak area is performed. The molar amount is obtained from the ratio of the peak areas.

The siloxane copolymer (A) may be employed in an amount ranging from 50 to 90% by weight, preferably 20 to 80% by weight, based on the total weight of the composition on the basis of the solids content, exclusive of solvents.

(B) Acrylic Copolymer

The positive-type photosensitive resin composition according to the present invention may comprise an acrylic copolymer (B).

The acrylic copolymer (B) may comprise (b-1) a structural unit derived from an ethylenically unsaturated carboxylic acid, an ethylenically unsaturated carboxylic anhydride, or a combination thereof; (b-2) a structural unit derived from an unsaturated compound containing an epoxy group; and (b-3) a structural unit derived from an ethylenically unsaturated compound different from the structural units (b-1) and (b-2).

The acrylic copolymer (B) is an alkali-soluble resin for materializing developability in the development step and also plays the role of a base for forming a film upon coating and a structure for forming a final pattern.

(b-1) Structural unit derived from an ethylenically unsaturated carboxylic acid, an ethylenically unsaturated carboxylic anhydride, or a combination thereof.

The structural unit (b-1) is derived from an ethylenically unsaturated carboxylic acid, an ethylenically unsaturated carboxylic anhydride, or a combination thereof. The ethylenically unsaturated carboxylic acid, the ethylenically unsaturated carboxylic anhydride, or a combination thereof is a polymerizable unsaturated compound containing at least one carboxyl group in the molecule. It may be at least one selected from an unsaturated monocarboxylic acid such as (meth)acrylic acid, crotonic acid, alpha-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like. But it is not limited thereto. (Meth)acrylic acid among the above is preferable from the viewpoint of developability.

The amount of the structural unit (b-1) may be 5 to 50% by mole, preferably 10 to 40% by mole, based on the total moles of the structural units constituting the acrylic copolymer (B). Within the above range, it is possible to attain a pattern formation of a film while keeping favorable developability.

(b-2) Structural unit derived from an unsaturated compound containing an epoxy group The structural unit (b-2) is derived from an unsaturated monomer containing an epoxy group. Particular examples of the unsaturated monomer containing an epoxy group may include glycidyl (meth)acrylate, 4-hydroxybutyl acrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, and a combination thereof. Glycidyl (meth)acrylate, 3,4-epoxycyclohexyl (meth)acrylate, 4-hydroxybutyl acrylate glycidyl ether, or a mixture thereof is preferable from the viewpoint of storage stability at room temperature and solubility.

The amount of the structural unit derived from an unsaturated compound containing an epoxy group (b-2) may be 1 to 45% by mole, preferably 3 to 30% by mole, based on the total moles of the structural units constituting the acrylic copolymer (B). Within the above range, the storage stability of the composition may be maintained, and the film retention rate upon post-bake may be advantageously enhanced.

(b-3) Structural unit derived from an ethylenically unsaturated compound different from the structural units (b-1) and (b-2)

The structural unit (b-3) is derived from an ethylenically unsaturated compound different from the structural units (b-1) and (b-2). The ethylenically unsaturated compound different from the structural units (b-1) and (b-2) may be at least one selected from the group consisting of an ethylenically unsaturated compound having an aromatic ring such as phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate, styrene, methylstyrene, dimethylstyrene, trimethylstyrene, ethylstyrene, diethylstyrene, triethylstyrene, propylstyrene, butylstyrene, hexylstyrene, heptylstyrene, octylstyrene, fluorostyrene, chlorostyrene, bromostyrene, iodostyrene, methoxy styrene, ethoxystyrene, propoxystyrene, p-hydroxy-α-methylstyrene, acetylstyrene, vinyl toluene, divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, dicyclopentenyloxyethyl (meth)acrylate, glycidyl (meth)acrylate, 3,4-epoxybutyl (meth)acrylate, 4,5-epoxypentyl (meth)acrylate, 5,6-epoxyhexyl (meth)acrylate, and 6,7-epoxyheptyl (meth)acrylate; an N-vinyl tertiary amine containing an N-vinyl group such as N-vinyl pyrrolidone, N-vinyl carbazole, and N-vinyl morpholine; an unsaturated ether such as vinyl methyl ether and vinyl ethyl ether; and an unsaturated imide such as N-phenylmaleimide, N-(4-chlorophenyl)maleimide, N-(4-hydroxyphenyl)maleimide, and N-cyclohexylmaleimide.

The amount of the structural unit (b-3) may be 5 to 70% by mole, preferably 15 to 65% by mole, based on the total moles of the structural units constituting the acrylic copolymer (B). Within the above amount range, it is possible to control the reactivity of the acrylic copolymer (i.e., an alkali-soluble resin) and to increase the solubility thereof in an aqueous alkaline solution, so that the applicability of the photosensitive resin composition can be remarkably enhanced.

The acrylic copolymer (B) may be prepared by compounding each of the compounds that provide the structural units (b-1), (b-2), and (b-3), adding a molecular weight controlling agent, a polymerization initiator, a solvent, and the like thereto, followed by charging nitrogen thereto and slowly stirring the mixture for polymerization.

The molecular weight controlling agent is not particularly limited. It may be a mercaptan compound such as butyl mercaptan, octyl mercaptan, lauryl mercaptan, and the like, or α-methyl styrene dimer.

The polymerization initiator is not particularly limited. It may be an azo compound such as 2,2'-azobisisobutyronitrile, 2,2'-azobis(2,4-dimethylvaleronitrile), and 2,2'-azobis(4-methoxy-2,4-dimethylvaleronitrile); benzoyl peroxide; lauryl peroxide; t-butyl peroxypivalate; or 1,1-bis(t-butylperoxy)cyclohexane. The polymerization initiator may be used alone or in combination of two or more thereof.

In addition, the solvent may be any solvent commonly used in the preparation of an acrylic copolymer (B). It may preferably be methyl 3-methoxypropionate or propylene glycol monomethyl ether acetate (PGMEA).

In particular, it is possible to reduce the residual amount of unreacted monomers by keeping the reaction time longer while maintaining the reaction conditions to be milder during the polymerization reaction.

The reaction conditions and the reaction time are not particularly limited. For example, the reaction temperature may be adjusted to a temperature lower than the conventional temperature, for example, from room temperature to 60° C. or from room temperature to 65° C. Then, the reaction time is to be maintained until a sufficient reaction takes place.

It is possible to reduce the residual amount of unreacted monomers in the acrylic copolymer (B) to a very minute level when the acrylic copolymer (B) is prepared by the above process.

The term "unreacted monomers (or residual monomers)" of the acrylic copolymer (B) as used herein refers to the amount of the compounds (i.e., monomers) that aim to provide the structural units (b-1) to (b-3) of the acrylic copolymer (B), but do not participate in the reaction (i.e., do not form a chain of the copolymer).

Specifically, the amount of unreacted monomers of the acrylic copolymer (B) remaining in the photosensitive resin composition of the present invention may be 2 parts by weight or less, preferably 1 part by weight or less, based on 100 parts by weight of the copolymer (on the basis of solids content).

Here, the term solids content refers to the amount of the composition, exclusive of solvents.

The weight average molecular weight (Mw) of the copolymer thus prepared may be in the range of 500 to 50,000 Da, preferably 3,000 to 30,000 Da, when determined by gel permeation chromatography (eluent: tetrahydrofuran) referenced to a polystyrene standard. Within the above range, the adhesiveness to a substrate is excellent, the physical and chemical properties are good, and the viscosity is proper.

The acrylic copolymer (B) may be employed in an amount ranging from 1 to 90% by weight, preferably 10 to 70% by weight, based on the total weight of the composition on the basis of the solids content, exclusive of solvents.

The siloxane copolymer (A) may be employed in an amount ranging from 10 to 99% by weight, preferably 30 to 85% by weight, based on the total weight of the siloxane copolymer (A) and the acrylic copolymer (B). Within the above range, the developability is appropriately adjusted, so that it is advantages in that the film formation and the pattern resolution are excellent.

(C) Solvent

The positive-type photosensitive resin composition of the present invention may be prepared in the form of a liquid composition in which the above components are mixed with a solvent. The solvent may be, for example, an organic solvent.

The amount of the solvent in the positive-type photosensitive resin composition according to the present invention is not particularly limited. For example, the solvent may be employed such that the solids content is 10 to 70% by weight, preferably 15 to 60% by weight, based on the total weight of the composition.

The term solids content refers to the components constituting the composition, exclusive of solvents. If the amount of the solvent is within the above range, the coating of the composition can be readily carried out, and the flowability thereof can be maintained at a proper level.

The solvent of the present invention is not particularly limited as long as it can dissolve the above-mentioned components and is chemically stable. For example, the solvent may be alcohols, ethers, glycol ethers, ethylene glycol alkyl ether acetates, diethylene glycol, propylene glycol monoalkyl ethers, propylene glycol alkyl ether acetates, propylene glycol alkyl ether propionates, aromatic hydrocarbons, ketones, esters, or the like.

Particular examples of the solvent include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among the above are ethylene glycol alkyl ether acetates, diethylene glycols, propylene glycol monoalkyl ethers, propylene glycol alkyl ether acetates, ketones and the like. In particular, preferred are diethylene glycol dimethyl ether, diethylene glycol ethyl methyl ether, dipropylene glycol dimethyl ether, dipropylene glycol diethyl ether, propylene glycol monomethyl ether, propylene glycol monoethyl ether, propylene glycol methyl ether acetate, methyl 2-methoxypropionate, γ-butyrolactone, 4-hydroxy-4-methyl-2-pentanone, and the like.

The solvents exemplified above may be used alone or in combination of two or more thereof.

(D) 1,2-Quinonediazide-Based Compound

The positive-type photosensitive resin composition according to the present invention may further comprise a 1,2-quinonediazide-based compound (D).

Since the 1,2-quinonediazide-based compound is used in combination with the siloxane copolymer (A) to further enhance the pattern formation and transparency of a cured film, the 1,2-quinonediazide-based compound may be employed, if necessary.

The 1,2-quinonediazide-based compound may be a compound used as a photosensitive agent in the photoresist field.

Examples of the 1,2-quinonediazide-based compound include an ester of a phenolic compound and 1,2-benzoquinonediazide-4-sulfonic acid or 1,2-benzoquinonediazide-5-sulfonic acid; an ester of a phenolic compound and 1,2-naphthoquinonediazide-4-sulfonic acid or 1,2-naphthoquinonediazide-5-sulfonic acid; a sulfonamide of a phenolic compound in which the hydroxyl group is substituted with an amino group and 1,2-benzoquinonediazide-4-sulfonic acid or 1,2-benzoquinonediazide-5-sulfonic acid; a sulfonamide of a phenolic compound in which the hydroxyl group is substituted with an amino group and 1,2-naphthoquinonediazide-4-sulfonic acid or 1,2-naphthoquinonediazide-5-sulfonic acid. The above compounds may be used alone or in combination of two or more thereof.

Examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, 2,2,4-trimethyl-7,2',4'-trihydroxyflavane, and the like.

More particular examples of the 1,2-quinonediazide-based compound include an ester of 2,3,4-trihydroxybenzophenone and 1,2-naphthoquinonediazide-4-sulfonic acid, an ester of 2,3,4-trihydroxybenzophenone and 1,2-naphthoquinonediazide-5-sulfonic acid, an ester of 4,4'-[1-[4-[1-[4-hydroxyphenyl]-1-methylethyl]phenyl]ethylidene]bisphenol and 1,2-naphthoquinonediazide-4-sulfonic acid, an ester of 4,4'-[1-[4-[1-[4-hydroxyphenyl]-1-methylethyl]phenyl]ethylidene]bisphenol and 1,2-naphthoquinonediazide-5-sulfonic acid, and the like.

The above compounds may be used alone or in combination of two or more thereof.

If the preferable compounds exemplified above are used, the transparency of the photosensitive resin composition may be further enhanced.

The 1,2-quinonediazide-based compound (D) may be employed in an amount ranging from 2 to 30 parts by weight, preferably 2 to 20 parts by weight, based on 100 parts by weight of the siloxane copolymer (A) on the basis of the solids content. Within the above range, a pattern is more readily formed, and it is possible to suppress such defects as a rough surface of a coated film upon the formation thereof and such a pattern shape as scum appearing at the bottom portion of the pattern upon development.

(E) Epoxy Compound

The positive-type photosensitive resin composition according to the present invention may further comprise an epoxy compound, along with the siloxane copolymer (A). The epoxy compound may increase the internal density of the resin composition, to thereby enhance the chemical resistance of a cured film formed therefrom.

The epoxy compound may be a homo-oligomer or a hetero-oligomer of an unsaturated monomer containing at least one epoxy group.

Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, and a mixture thereof. Preferably, glycidyl methacrylate may be used.

The epoxy compound may be synthesized by any conventional methods well known in the art.

An example of the commercially available epoxy compound may include GHP03 (glycidyl methacrylate homopolymer, Miwon Commercial Co., Ltd.).

The epoxy compound (E) may further comprise the following structural unit.

Particular examples thereof may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the compounds exemplified above may be contained in the epoxy compound (E) alone or in combination of two or more thereof.

Specifically, the styrene-based compounds are preferred among the above from the viewpoint of polymerizability.

In particular, it is more preferable in terms of the chemical resistance that the epoxy compound (E) does not contain a carboxyl group by way of not using a structural unit derived from a monomer containing a carboxyl group among the above.

The structural unit may be contained in an amount of 0 to 70% by mole, preferably 10 to 60% by mole, based on the total molar amount of the structural units constituting the epoxy compound (E). Within the above range, it may be more advantageous in terms of the film strength.

Preferably, the weight average molecular weight of the epoxy compound (E) may be in the range of 100 to 30,000 Da. More preferably, the weight average molecular weight thereof may be in the range of 1,000 to 15,000 Da. If the weight average molecular weight of the epoxy compound is 100 Da or more, a cured film may have more excellent hardness. Also, if the weight average molecular weight of the epoxy compound is 30,000 Da or less, a cured film may have a uniform thickness, which is suitable for planarizing any steps thereon.

In the positive-type photosensitive resin composition of the present invention, the epoxy compound (E) may be employed in an amount ranging from 0 to 40 parts by weight, preferably 5 to 25 parts by weight, based on 100 parts by weight of the siloxane copolymer (A) on the basis of the solids content. Within the above range, the chemical resistance and sensitivity of the photosensitive resin composition may be more favorable.

(F) Silane Compound

The positive-type photosensitive resin composition of the present invention may comprise at least one silane compound represented by the following Formula 5, especially a silane monomer of T-type and/or Q-type, to thereby improve the chemical resistance in the treatment of a post-process by reducing the content of highly reactive silanol groups (Si—OH) in the siloxane copolymer, in association with the epoxy compound such as an epoxy oligomer.

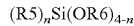

$(R5)_n Si(OR6)_{4-n}$     [Formula 5]

In the above Formula 5, n is an integer of 0 to 3, R5 is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and R6 is each independently hydrogen, $C_{1-6}$ alkyl, $C_{2-6}$ acyl, or $C_{6-15}$ aryl, wherein the heteroalkyl, the heteroalkenyl, and the heteroaryl each independently have at least one heteroatom selected from the group consisting of O, N, and S.

Examples of the structural unit wherein R5 has a heteroatom include an ether, an ester, and a sulfide.

The compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, phenyltrimethoxysilane, phenyltriethoxysilane, $d^3$-methyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxylsilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, butyltrimethoxysilane, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The silane compound (F) may be employed in an amount ranging from 0 to 20 parts by weight, preferably 4 to 12 parts by weight, based on 100 parts by weight of the siloxane copolymer (A) on the basis of the solids content. Within the above amount range, the chemical resistance of a cured film to be formed may be further enhanced.

(G) Surfactant

The positive-type photosensitive resin composition of the present invention may further comprise a surfactant to enhance its coatability, if desired.

The kind of the surfactant is not particularly limited. Examples thereof include fluorine-based surfactants, silicon-based surfactants, non-ionic surfactants, and the like.

Specific examples of the surfactant (G) may include fluorine- and silicon-based surfactants such as FZ-2122 supplied by Dow Corning Toray Co., Ltd., BM-1000 and BM-1100 supplied by BM CHEMIE Co., Ltd., Megapack F-142 D, F-172, F-173, and F-183 supplied by Dai Nippon Ink Chemical Kogyo Co., Ltd., Florad FC-135, FC-170 C, FC-430, and FC-431 supplied by Sumitomo 3M Ltd., Sufron S-112, S-113, S-131, S-141, S-145, S-382, SC-101, SC-102, SC-103, SC-104, SC-105, and SC-106 supplied by Asahi Glass Co., Ltd., Eftop EF301, EF303, and EF352 supplied by Shinakida Kasei Co., Ltd., SH-28 PA, SH-190, SH-193, SZ-6032, SF-8428, DC-57, and DC-190 supplied by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like; polyoxyethylene aryl ethers including polyoxyethylene octylphenyl ether, polyoxyethylene nonylphenyl ether, and the like; and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth)acrylate-based copolymer Polyflow No. 57 and 95 (manufactured by Kyoei Yuji Chemical Co., Ltd.), and the like. They may be used alone or in combination of two or more thereof.

The surfactant (G) may be employed in the photosensitive resin composition in an amount ranging from 0.001 to 5 parts by weight, preferably 0.05 to 2 parts by weight, based on 100 parts by weight of the siloxane copolymer (A) on the basis of the solids content. Within the above amount range, the coating of the composition can be readily carried out.

(H) Adhesion Supplement

The photosensitive resin composition of the present invention may further comprise an adhesion supplement to improve the adhesiveness to a substrate.

The adhesion supplement may have at least one reactive group selected from the group consisting of a carboxyl group, a (meth)acryloyl group, an isocyanate group, an amino group, a mercapto group, a vinyl group, and an epoxy group.

The kind of the adhesion supplement is not particularly limited. It may be at least one selected from the group consisting of trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, N-phenylaminopropyltrimethoxysilane, and β-(3,4-epoxycyclohexyl)ethyltrimethoxysilane. Preferred is γ-glycidoxypropyltrimethoxysilane, γ-glycidoxypropyltriethoxysilane, or N-phenylaminopropyltrimethoxysilane, which is capable of enhancing the film retention rate and is excellent in the adhesiveness to a substrate.

The adhesion supplement (H) may be employed in an amount ranging from 0 to 5 parts by weight, preferably 0.001 to 2 parts by weight, based on 100 parts by weight of the siloxane copolymer (A) on the basis of the solids content. Within the above amount range, the adhesiveness to a substrate may be further enhanced.

In addition to the above, other additive components may be comprised in the photosensitive resin composition of the present invention within a range that does not adversely affect the physical properties of the composition.

The photosensitive resin composition according to the present invention may be used as a positive-type photosensitive resin composition.

In particular, the positive-type photosensitive resin composition of the present invention comprises a siloxane copolymer containing a sulfonated diazoquinone group as a photoactive group at the terminal thereof, wherein the photoactive group is activated by light. The silanol group is protected by the sulfonated diazoquinone group in an unexposed area at the time of formation of a cured film, which lowers the dissolution rate of the siloxane copolymer. Thus, the film retention rate and adhesiveness can be further enhanced. Further, the sulfonated diazoquinone group is converted to a carboxyl group by an ultraviolet ray in an exposed area. Thus, the siloxane copolymer can be readily dissolved in the developer (with an enhanced solubility) in the development step. Thus, the sensitivity can be enhanced.

That is, since the siloxane copolymer (A) containing a silanol group stabilized by a sulfonated diazoquinone group is employed, the solubility of the siloxane copolymer (A) in an alkaline solution is enhanced by light. Thus, the film retention rate and adhesiveness can be maintained to be excellent.

The present invention provides a cured film formed from the photosensitive resin composition.

The cured film may be formed by a method known in the art, for example, a method in which the photosensitive resin composition is coated on a substrate and then cured.

More specifically, in the curing step, the photosensitive resin composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution, to form a pattern on the coating layer. Thereafter, the patterned coating layer, if necessary, is subjected to post-bake, for example, at a temperature of 150 to 300° C. for 10 minutes to 5 hours to prepare a desired cured film. The exposure to light may be carried out at an exposure rate of 10 to 200 $mJ/cm^2$ based on a wavelength of 365 nm in a wavelength band of 200 to 500 nm. According to the method of the present invention, it is possible to easily form a desired pattern from the viewpoint of the process.

The coating of the photosensitive composition on to a substrate may be carried out by a spin coating method, a slit coating method, a roll coating method, a screen printing method, an applicator method, or the like, in a desired thickness of, e.g., 2 to 25 μm. In addition, as a light source used for the exposure (irradiation), a low-pressure mercury lamp, a high-pressure mercury lamp, an extra high-pressure mercury lamp, a metal halide lamp, an argon gas laser, or the like, may be used. X-ray, electronic ray, or the like, may also be used, if desired.

The photosensitive resin composition of the present invention is capable of forming a cured film that is excellent in terms of the heat resistance, transparency, dielectric constant, solvent resistance, acid resistance, and alkali resistance. Thus, the cured film of the present invention thus prepared has excellent light transmittance devoid of surface roughness when the cured film is subjected to heat treatment or is immersed in, or brought into contact with, a solvent, an acid, an alkali, or the like. Thus, the cured film can be advantageously used as a planarization film for a TFT substrate of a liquid crystal display or an organic EL display; a partition of an organic EL display; an interlayer dielectric of a semiconductor device; a core or cladding material of an optical waveguide, and the like. Further, the present invention provides an electronic part that comprises the cured film as a protective film.

Hereinafter, the present invention will be described in more detail with reference to the following examples. However, these examples are provided to illustrate the present invention, and the scope of the present invention is not limited thereto only.

In the following synthesis examples, the weight average molecular weight is determined by gel permeation chromatography (GPC) using a polystyrene standard.

Synthesis Example 1

Synthesis of a Siloxane Copolymer (A-1) Containing a Diazoquinone Group

Step 1: Siloxane Polymer I

A reactor equipped with a reflux condenser was charged with 40% by weight of phenyltrimethoxysilane, 15% by weight of methyltrimethoxysilane, 20% by weight of tetraethoxysilane, and 20% by weight of pure water. Added thereto was 5% by weight of propylene glycol monomethyl ether acetate (PGMEA, Chemtronics), followed by stirring the mixture with reflux for 7 hours in the presence of 0.1% by weight of an oxalic acid catalyst based on the total weight of the mixture and then cooling it. Thereafter, the resultant was diluted with PGMEA such that the solids content was 40% by weight. As a result, siloxane polymer I having a weight average molecular weight of about 5,000 to 8,000 Da was synthesized.

Step 2: Siloxane Polymer II

A reactor equipped with a reflux condenser was charged with 20% by weight of phenyltrimethoxysilane, 30% by weight of methyltrimethoxysilane, 20% by weight of tetraethoxysilane, and 15% by weight of pure water. Added thereto was 15% by weight of PGMEA, followed by stirring the mixture with reflux for 6 hours in the presence of 0.1% by weight of an oxalic acid catalyst based on the total weight of the mixture and then cooling it. Thereafter, the resultant was diluted with PGMEA such that the solids content was 30% by weight. As a result, siloxane polymer II having a weight average molecular weight of about 8,000 to 13,000 Da was synthesized.

Step 3: Siloxane Copolymer (A-1) Containing a Diazoquinone Group

The siloxane polymers I and II synthesized in the above steps 1 and 2 were mixed in the same solids content (30% by weight). Next, added thereto was 0.38% by weight of TPA-523 (Miwon Commercial Co., Ltd.) as a sulfonated diazoquinone-based compound based on the total solids content of the mixture of the siloxane polymers I and II, followed by stirring the mixture for 3 hours to thereby synthesize a siloxane copolymer (A-1) containing a sulfonated diazoquinone group, specifically a sulfonated diazonaphthoquinone group, at the terminal thereof.

Synthesis Examples 2 to 16

Synthesis of Siloxane Copolymers (A-2 to A-16) Containing a Diazoquinone Group Siloxane copolymers containing a diazoquinone group were prepared in the same manner as in Synthesis Example 1, except that the solids content of the sulfonated diazoquinone-based compound based on the total solids content of the mixture of the siloxane polymers I and II was changed as shown in Table 2 below.

Synthesis Example 17

Synthesis of a Siloxane Copolymer Containing no Diazoquinone Group

A siloxane copolymer containing no diazoquinone group was prepared in the same manner as in the step 1 of Synthesis Example 1 for the preparation of the siloxane copolymer I.

Synthesis Example 18

Synthesis of an Acrylic Copolymer (B)

A flask equipped with a cooling tube and a stirrer was charged with 200 parts by weight of PGMEA as a solvent, and the temperature of the solvent was raised to 70° C. while the solvent was stirred slowly. Next, added thereto were 20.3 parts by weight of styrene, 16.5 parts by weight of methacrylate, 20.8 parts by weight of glycidyl methacrylate, 30.6 parts by weight of methyl methacrylate, and 11.8 parts by weight of methacrylic acid, followed by dropwise adding of 3 parts by weight of 2,2'-azobis(2,4-dimethylvaleronitrile) as a radical polymerization initiator over 5 hours to carry out a polymerization reaction. Then, the resultant was diluted with PGMEA such that the solids content was 32% by weight. As a result, an acrylic copolymer having a weight average molecular weight of about 9,000 to 11,000 Da was synthesized.

Synthesis Example 18

Synthesis of an Epoxy Compound

A three-necked flask equipped with a cooling tube was placed on a stirrer with an automatic temperature controller. The flask was charged with 100 parts by weight of a monomer composed of glycidyl methacrylate (100% by mole), 10 parts by weight of 2,2'-azobis(2-methylbutyronitrile), and 100 parts by weight of PGMEA, followed by charging the flask with nitrogen. Thereafter, the temperature of the solution was raised to 80° C. while the solution was stirred slowly, and the temperature was maintained for 5 hours. Next, the resultant was diluted with PGMEA such that the solids content was 20% by weight. As a result, an epoxy compound having a weight average molecular weight of about 6,000 to 10,000 Da was synthesized.

Examples and Comparative Examples: Preparation of Photosensitive Resin Compositions The photosensitive resin compositions of the following Examples and Comparative Examples were prepared using the compounds prepared in the above Synthesis Examples.

The components used in the following Examples and Comparative Examples are as follows.

TABLE 1

| | | Component | Solids content (wt. %) | Manufacturer |
|---|---|---|---|---|
| A | Siloxane copolymer containing a diazoquinone group | Synthesis Examples 1 to 16 (A-1 to A-16) | 30 | — |
| | Siloxane copolymer containing no diazoquinone group | Synthesis Example 17 (A-17) | 40 | — |

TABLE 1-continued

| | Component | | Solids content (wt. %) | Manufacturer |
|---|---|---|---|---|
| B | Acrylic copolymer | Synthesis Example 18 | 32 | — |
| C | Solvent | Propylene glycol monomethyl ether acetate (PGMEA) | — | Chemtronics |
| D | 1,2-quinonediazide compound | TPA-523, 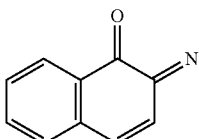 | 100 | Miwon |
| E | Epoxy compound | GHP03 | 20 | Chemtronics |
| F | Silane monomer | Phenyltrimethoxysilane (OFS-6124 silane) | 100 | Xiameter |
| G | Surfactant | Silicon-based leveling surfactant (FZ-2122) | 100 | Dow Corning Toray |

Example 1

6.938 g of the siloxane copolymer (A-1) of Synthesis Example 3, 15.1815 g of the acrylic copolymer (B) of Synthesis Example 18, 1.5705 g of the epoxy compound (E) of Synthesis Example 19, 1.25 g of the silane compound (F), and 0.06 g of the surfactant (G) were homogeneously mixed. In such event, the respective contents are those based on the solids content exclusive of the solvent. The mixture was dissolved in PGMEA such that that the solids content of the mixture was 25% by weight. The solution was stirred for 3 hours and filtered through a membrane filter having a pore size of 0.2 μm to obtain a composition solution having a solids content of 25% by weight.

Examples 2 to 18 and Comparative Examples 1 to 5

Photosensitive resin compositions were each prepared in the same manner as in Example 1, except that the kinds and/or contents of the respective components were changed as shown in Table 2 below.

TABLE 2

| | Siloxane copolymer (A) | | | Diazoquinone comp'd based on siloxane solids content (wt. %) | Acrylic copolymer (B) (g) | 1,2-quinonediazide comp'd (D) (g) | Epoxy comp'd (E) (g) | Silane comp'd (F) (g) | Surfactant (G) (g) |
|---|---|---|---|---|---|---|---|---|---|
| | | Solids content (g) | Amount (g) | | | | | | |
| Ex. 1 | A-1 | 6.938 | — | — | 0.38 | 15.1815 | — | 1.5705 | 1.25 | 0.06 |
| Ex. 2 | A-2 | 7.985 | — | — | 0.3 | 14.1345 | — | 1.5705 | 1.25 | 0.06 |
| Ex. 3 | A-3 | 9.032 | — | — | 0.25 | 13.0875 | — | 1.5705 | 1.25 | 0.06 |
| Ex. 4 | A-4 | 13.22 | — | — | 0.15 | 8.8995 | — | 1.5705 | 1.25 | 0.06 |
| Ex. 5 | A-5 | 17.408 | — | — | 0.11 | 4.7115 | — | 1.5705 | 1.25 | 0.06 |
| Ex. 6 | A-6 | 18.456 | — | — | 0.1 | 3.6645 | — | 1.5705 | 1.25 | 0.06 |
| Ex. 7 | A-7 | 12.97 | — | — | 0.12 | 9.112 | — | 1.608 | 1.25 | 0.06 |
| Ex. 8 | A-8 | 13.47 | — | — | 0.18 | 8.687 | — | 1.533 | 1.25 | 0.06 |
| Ex. 9 | A-9 | 12.72 | — | — | 0.12 | 8.8995 | 0.5525 | 1.5705 | 1.25 | 0.06 |
| Ex. 10 | A-10 | 13.22 | — | — | 0.15 | 10.47 | — | — | 1.25 | 0.06 |
| Ex. 11 | A-11 | 4.844 | — | — | 0.75 | 17.2755 | — | 1.5705 | 1.25 | 0.06 |
| Ex. 12 | A-12 | 5.891 | — | — | 0.5 | 16.2285 | — | 1.5705 | 1.25 | 0.06 |
| Ex. 13 | A-13 | 19.502 | — | — | 0.09 | 2.6175 | — | 1.5705 | 1.25 | 0.06 |
| Ex. 14 | A-14 | 21.596 | — | — | 0.08 | 0.5235 | — | 1.5705 | 1.25 | 0.06 |
| Ex. 15 | A-15 | 12.72 | — | — | 0.09 | 9.3245 | — | 1.6455 | 1.25 | 0.06 |
| Ex. 16 | A-16 | 13.72 | — | — | 0.22 | 8.4745 | — | 1.4955 | 1.25 | 0.06 |

TABLE 2-continued

| | Siloxane copolymer (A) | | Diazoquinone comp'd based on siloxane solids content (wt. %) | | Acrylic copolymer (B) (g) | 1,2-quinonediazide comp'd (D) (g) | Epoxy comp'd (E) (g) | Silane comp'd (F) (g) | Surfactant (G) (g) |
|---|---|---|---|---|---|---|---|---|---|
| | Solids content (g) | Amount (g) | | | | | | | |
| C. Ex. 1 | A-17 | 3.141 | A-18 | 3.141 | — | 13.0875 | 2.75 | 1.5705 | 1.25 | 0.06 |
| C. Ex. 2 | A-17 | 5.235 | A-18 | 5.235 | — | 8.8995 | 2.75 | 1.5705 | 1.25 | 0.06 |
| C. Ex. 3 | A-17 | 7.329 | A-18 | 7.329 | — | 4.7115 | 2.75 | 1.5705 | 1.25 | 0.06 |
| C. Ex. 4 | A-17 | 5.36 | A-18 | 5.36 | — | 9.112 | 2.75 | 1.608 | 1.25 | 0.06 |
| C. Ex. 5 | A-17 | 5.235 | A-18 | 5.235 | — | 10.47 | 2.75 | — | 1.25 | 0.06 |

Test Example 1

Evaluation of Sensitivity

The resin compositions prepared in the Examples and the Comparative Examples were each coated onto a glass substrate by spin coating. The coated substrate was then pre-baked on a hot plate kept at 100° C. for 90 seconds to form a dried film. The dried film was exposed, through a mask having a pattern of square holes in a size ranging from 1 μm to 30 μm, to light at an exposure rate of 0 to 200 mJ/cm$^2$ based on a wavelength of 365 nm for a certain time period using an aligner (model name: MA6) that emits light having a wavelength of 200 nm to 450 nm (i.e., bleaching step), in which the gap between the mask and the substrate was 25 μm. It was then developed for 60 seconds with a developer, which was an aqueous solution of 2.38% by weight of TMAH, through puddle nozzles at 23° C. The exposed film thus obtained was heated in a convection oven at 230° C. for 30 minutes to prepare a cured film having a thickness of 2 μm. For the hole pattern formed per a size of the mask of 10 μm in the above procedure, the amount of exposure energy for attaining a critical dimension (CD, unit: μm) of 10 μm was measured. The lower the value (mJ/cm$^2$), the better the sensitivity.

Test Example 2

Evaluation of Film Retention Rate

The resin compositions prepared in the Examples and the Comparative Examples were each coated onto a glass substrate by spin coating. The coated substrate was then pre-baked on a hot plate kept at 100° C. for 90 seconds to form a dried film. The dried film was developed for 60 seconds with a developer, which was an aqueous solution of 2.38% by weight of TMAH, through puddle nozzles at 23° C. It was then exposed to light at an exposure rate of 200 mJ/cm$^2$ based on a wavelength of 365 nm for a certain time period using an aligner (model name: MA6) that emits light having a wavelength of 200 nm to 450 nm (i.e., bleaching step). Thereafter, the exposed film thus obtained was heated in a convection oven at 230° C. for 30 minutes to prepare a cured film having a thickness of 2 μm. The film retention rate (%) was obtained from the following Equation 1 by calculating the ratio in a percent of the thickness of the film after the post-bake to that of the film after the pre-bake by using a measuring instrument (SNU Precision). The higher the numerical value, the better the film retention rate. Specifically, if the film retention rate was 50% or higher, it was evaluated as good. If it was 70% or higher, it was evaluated as excellent.

Film retention rate (%)=(film thickness after post-bake/film thickness after pre-bake)×100  [Equation 1]

Test Example 3

Evaluation of Adhesiveness

The resin compositions prepared in the Examples and the Comparative Examples were each coated onto a glass substrate by spin coating. The coated substrate was then pre-baked on a hot plate kept at 100° C. for 90 seconds to form a dried film. A cured film was obtained in the same manner as in Example 1, except that a photomask having each pattern of 6 lines ranging from 1 μm to 30 μm at an interval of 1 μm was applied. Then, the extent of the smallest line pattern remaining in the 1 to 30 μm line patterns on a silicon nitride substrate was observed using a microscope. During the microscopic observation, the pattern of the lowest CD size remaining after the line patterns had been detached with the mask was evaluated as development adhesiveness. The smaller the minimum residual pattern size, the better the development adhesiveness. Specifically, if the minimum residual pattern size was 4 μm or smaller, it was marked as ⊚. If it was 5 μm to less than 8 μm, it was marked as ○. If it was 8 μm or larger, it was marked as ×.

Test Example 4

Evaluation of Transmittance

Cured films were each obtained in the same manner as in Test Example 2 above. The post-baked film having a thickness of 2 μm was measured for the transmittance at a wavelength of 400 nm using a UV-Visible spectrometer (Cary 100, Agilent Korea). The higher the value at a wavelength of 400 nm, the better the transmittance. Specifically, if it was 80% or higher, it was evaluated as good. If it was 85% or higher, it was evaluated as excellent.

Test Example 5

Evaluation of Chemical Resistance

Cured films were each obtained in the same manner as in Test Example 2 above. The cured film was measured for the initial thickness (T1) using a non-contact type film thickness measuring instrument (SNU Precision). Then, a stripper chemical (product name: TOK-106) was placed in a thermostatic chamber kept at 50° C. The cured film was immersed in the stripper chemical for 3 minutes. The cured film was washed with DI water (ultrapure water), and the residues were removed with air. Then, the film thickness (T2) was measured.

The chemical resistance was obtained from the measured values by the following Equation 2 (i.e., calculation of a swollen thickness upon the evaluation test of chemical resistance). In such event, if the change in thickness (%) after the evaluation test of chemical resistance was 105% or less, the chemical resistance was evaluated as good. If it was 103% or less, it was evaluated as excellent.

Change in swollen thickness (%) after the evaluation test of chemical resistance=film thickness (T2) upon immersion in a stripper chemical−film thickness (T1) before immersion in a stripper chemical  [Equation 2]

Test Example 6

Evaluation of the Appearance of a Cured Film

Cured films were each obtained in the same manner as in Test Example 2 above. The surface of the cured film was observed with the naked eyes.

TABLE 3

|  | A (wt. %) | B (wt. %) | Sensitivity (mJ/cm$^2$) | Film retention rate (%) | Adhesiveness Pattern size (μm) | (○ ◉ X) | Transmittance | Chemical resistance (%) |
|---|---|---|---|---|---|---|---|---|
| Ex. 1 | 31 | 69 | 38.5 | 70.4 | 3 | ◉ | 90.14 | 100 |
| Ex. 2 | 36 | 64 | 38.5 | 71.9 | 3 | ◉ | 90.63 | 100 |
| Ex. 3 | 41 | 59 | 31.5 | 74.9 | 5 | ○ | 91.00 | 100 |
| Ex. 4 | 60 | 40 | 28.0 | 88.5 | 4 | ◉ | 93.49 | 101 |
| Ex. 5 | 79 | 21 | 24.5 | 87.6 | 3 | ◉ | 95.70 | 101 |
| Ex. 6 | 83 | 17 | 19.6 | 88.5 | 3 | ◉ | 96.76 | 101 |
| Ex. 7 | 59 | 41 | 21.0 | 70.0 | 7 | ○ | 95.96 | 101 |
| Ex. 8 | 61 | 39 | 35.0 | 89.1 | 6 | ○ | 91.53 | 101 |
| Ex. 9 | 59 | 41 | 28.0 | 85.2 | 5 | ○ | 93.5 | 101 |
| Ex. 10 | 56 | 44 | 19.6 | 73.5 | 4 | ◉ | 93.2 | 101 |
| Ex. 11 | 22 | 78 | 38.5 | 67.3 | 5 | ○ | 87.68 | 100 |
| Ex. 12 | 27 | 73 | 38.5 | 68.9 | 3 | ◉ | 88.35 | 100 |
| Ex. 13 | 88 | 12 | 19.6 | 88.7 | 3 | ◉ | 96.81 | 104 |
| Ex. 14 | 98 | 2 | 21.0 | 82.0 | 7 | ○ | 98.36 | 105 |
| Ex. 15 | 58 | 42 | 21.0 | 56.8 | 5 | ○ | 97.98 | 103 |
| Ex. 16 | 62 | 38 | 84.0 | 90.0 | 5 | ○ | 88.90 | 101 |
| C. Ex. 1 | 32 | 68 | 31.5 | 72.2 | 8 | X | 91.2 | 100 |
| C. Ex. 2 | 54 | 46 | 28.0 | 84.0 | 15 | X | 93.3 | 101 |
| C. Ex. 3 | 76 | 24 | 24.5 | 85.2 | 15 | X | 95.68 | 101 |
| C. Ex. 4 | 54 | 46 | 21.0 | 67.1 | 20 | X | 95.94 | 101 |
| C. Ex. 5 | 50 | 50 | 19.6 | 69.5 | 8 | X | 93.3 | 101 |

As shown in Table 3 above, the compositions of the Examples, which fall within the scope of the present invention, were overall excellent in sensitivity, adhesiveness, and film retention rate. In contrast, the compositions of the Comparative Examples, which do not fall within the scope of the present invention, showed that at least one of these properties was unfavorable.

What is claimed is:

1. A positive-type photosensitive resin composition, which comprises:
   (A) a siloxane copolymer containing a photoactive group at at least one terminal thereof, the photoactive group being activated by light;
   (B) an acrylic copolymer; and
   (C) a solvent,
wherein the siloxane copolymer (A) comprises a structural unit derived from a silane compound represented by the following Formula 1:

  [Formula 1]

where n is 0,
R1 is each independently C$_{1-12}$ alkyl, C$_{2-10}$ alkenyl, C$_{6-15}$ aryl, 3- to 12-membered heteroalkyl, 4- to 10-membered heteroalkenyl, or 6- to 15-membered heteroaryl, and
R2 is each independently hydrogen, C$_{1-6}$ alkyl, C$_{2-6}$ acyl, or C$_{6-15}$ aryl,
wherein the heteroalkyl, the heteroalkenyl, and the heteroaryl each independently have at least one heteroatom selected from the group consisting of O, N, and S.

2. The positive-type photosensitive resin composition of claim 1, wherein the photoactive group is a sulfonated diazoquinone group derived from a sulfonated diazoquinone-based compound.

3. The positive-type photosensitive resin composition of claim 2, wherein the sulfonated diazoquinone group is a sulfonated diazobenzoquinone group or a sulfonated diazonaphthoquinone group.

4. The positive-type photosensitive resin composition of claim 1, wherein the acrylic copolymer (B) comprises (b-1) a structural unit derived from an ethylenically unsaturated carboxylic acid, an ethylenically unsaturated carboxylic anhydride, or a combination thereof; (b-2) a structural unit derived from an unsaturated compound containing an epoxy group; and (b-3) a structural unit derived from an ethylenically unsaturated compound different from the structural units (b-1) and (b-2).

5. The positive-type photosensitive resin composition of claim 1, wherein the siloxane copolymer (A) is employed in an amount ranging from 30 to 85% by weight based on the total weight of the siloxane copolymer (A) and the acrylic copolymer (B).

6. The positive-type photosensitive resin composition of claim 1, which further comprises a 1,2-quinonediazide compound.

7. The positive-type photosensitive resin composition of claim 1, which further comprises an epoxy compound.

8. The positive-type photosensitive resin composition of claim 1, which further comprises at least one silane compound represented by the following Formula 5:

$$(R5)_n Si(OR6)_{4-n} \quad \text{[Formula 5]}$$

wherein n is an integer of 0 to 3,

R5 is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and R6 is each independently hydrogen, $C_{1-6}$ alkyl, $C_{2-6}$ acyl, or $C_{6-15}$ aryl, wherein the heteroalkyl, the heteroalkenyl, and the heteroaryl each independently have at least one heteroatom selected from the group consisting of O, N, and S.

9. A cured film prepared from the positive-type photosensitive resin composition of claim 1.

* * * * *